(12) United States Patent
Kim et al.

(10) Patent No.: US 11,513,423 B2
(45) Date of Patent: Nov. 29, 2022

(54) SEMICONDUCTOR DEVICE, SEMICONDUCTOR DEVICE PACKAGE AND AUTO FOCUSING DEVICE

(71) Applicant: SUZHOU LEKIN SEMICONDUCTOR CO., LTD., Taicang (CN)

(72) Inventors: Seung Hwan Kim, Seoul (KR); Su Ik Park, Seoul (KR); Yong Gyeong Lee, Seoul (KR)

(73) Assignee: SUZHOU LEKIN SEMICONDUCTOR CO., LTD., Taicang (CN)

( * ) Notice: Subject to any disclaimer, the term of this patent is extended or adjusted under 35 U.S.C. 154(b) by 405 days.

(21) Appl. No.: 16/629,678

(22) PCT Filed: Oct. 19, 2018

(86) PCT No.: PCT/KR2018/012407
§ 371 (c)(1),
(2) Date: Jan. 9, 2020

(87) PCT Pub. No.: WO2019/078671
PCT Pub. Date: Apr. 25, 2019

(65) Prior Publication Data
US 2021/0088876 A1 Mar. 25, 2021

(30) Foreign Application Priority Data

Oct. 19, 2017 (KR) ........................ 10-2017-0136056

(51) Int. Cl.
*H01S 5/183* (2006.01)
*G03B 13/20* (2021.01)
(Continued)

(52) U.S. Cl.
CPC ............ *G03B 13/20* (2013.01); *G01S 7/4815* (2013.01); *G03B 13/36* (2013.01); *H01L 27/156* (2013.01);
(Continued)

(58) Field of Classification Search
CPC ....... G03B 13/20; G03B 13/36; G01S 7/4815; H01L 27/156; H01S 5/02212;
(Continued)

(56) References Cited

U.S. PATENT DOCUMENTS

2005/0158902 A1* 7/2005 Chua .................... B82Y 20/00
438/32
2010/0328747 A1 12/2010 Jikutani et al.
(Continued)

FOREIGN PATENT DOCUMENTS

KR 10-2010-0103868 A 9/2010
KR 10-2011-0125239 A 11/2011
(Continued)

*Primary Examiner* — Yuanda Zhang
(74) *Attorney, Agent, or Firm* — Birch, Stewart, Kolasch & Birch, LLP

(57) ABSTRACT

A semiconductor device comprises a substrate and a plurality of emitters disposed on the substrate. The emitter may comprise: a first conductive reflection layer having a first reflectivity; an active layer disposed on the first conductive reflection layer; an aperture layer disposed on the active layer and comprising an aperture region and a blocking region surrounding the aperture region; and a second conductive reflection layer disposed on the aperture layer and having a second reflectivity smaller than the first reflectivity. A diameter-to-pitch ratio of the aperture region of the aperture layer is 1:3 to 1:5, wherein the pitch may be defined as the distance between centers of aperture regions of aperture layers of adjacent emitters.

18 Claims, 6 Drawing Sheets

(51) Int. Cl.
    *H01S 5/042*         (2006.01)
    *H01S 5/02257*     (2021.01)
    *G01S 7/481*         (2006.01)
    *G03B 13/36*        (2021.01)
    *H01L 27/15*        (2006.01)
    *H01S 5/02212*     (2021.01)
    *H01S 5/42*          (2006.01)

(52) U.S. Cl.
    CPC ...... *H01S 5/02212* (2013.01); *H01S 5/02257* (2021.01); *H01S 5/04256* (2019.08); *H01S 5/18311* (2013.01); *H01S 5/18344* (2013.01); *H01S 5/423* (2013.01)

(58) Field of Classification Search
    CPC ............. H01S 5/02257; H01S 5/04256; H01S 5/18311; H01S 5/18344; H01S 5/423
    See application file for complete search history.

(56) References Cited

U.S. PATENT DOCUMENTS

| | | | |
|---|---|---|---|
| 2011/0267415 A1* | 11/2011 | Ohba | ............... G02B 5/005 359/204.1 |
| 2011/0316961 A1 | 12/2011 | Hanaoka | |
| 2012/0305746 A1 | 12/2012 | Moon et al. | |
| 2013/0163627 A1* | 6/2013 | Seurin | ............... H01S 5/02345 372/36 |

FOREIGN PATENT DOCUMENTS

| | | |
|---|---|---|
| KR | 10-2012-0133644 A | 12/2012 |
| KR | 10-1467959 B1 | 12/2014 |
| KR | 10-2016-0018923 A | 2/2016 |

* cited by examiner

[FIG. 1]
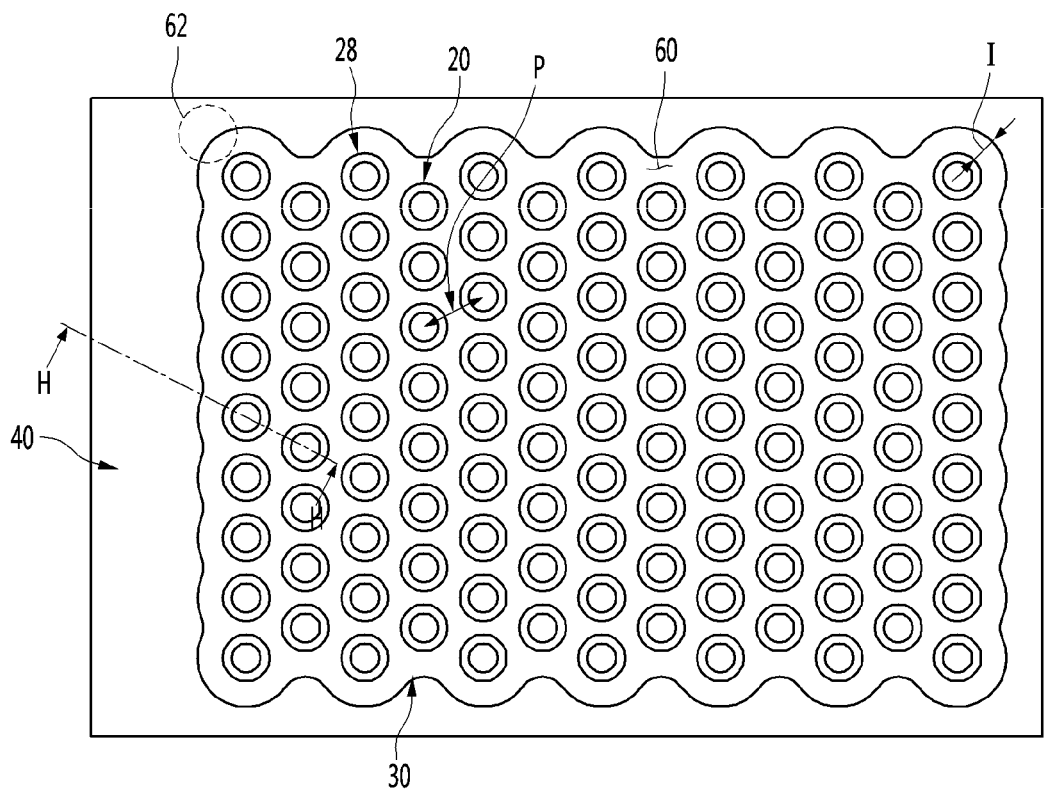

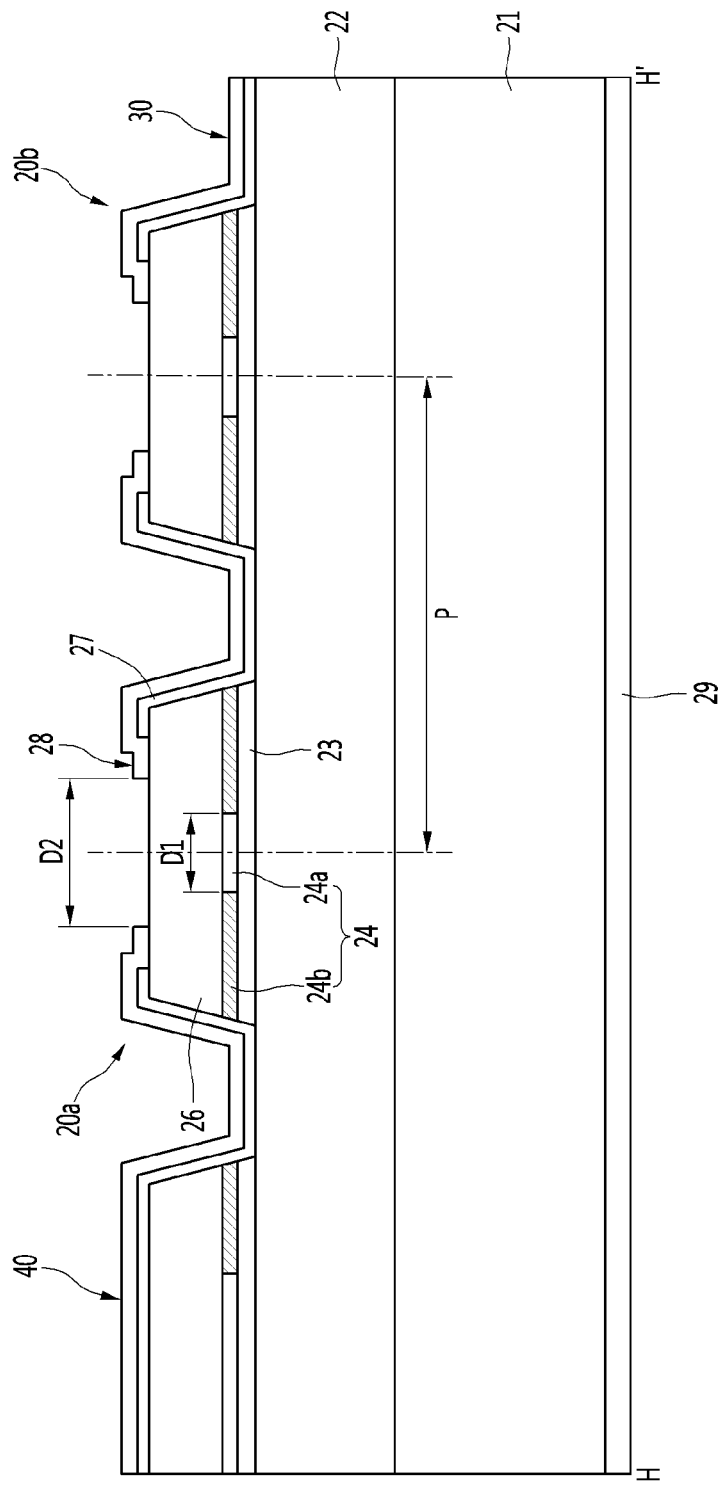
[FIG. 2]

【FIG. 3】
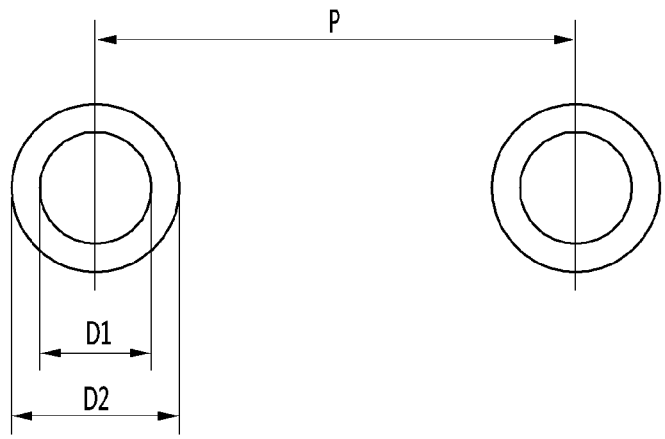
【FIG. 4】
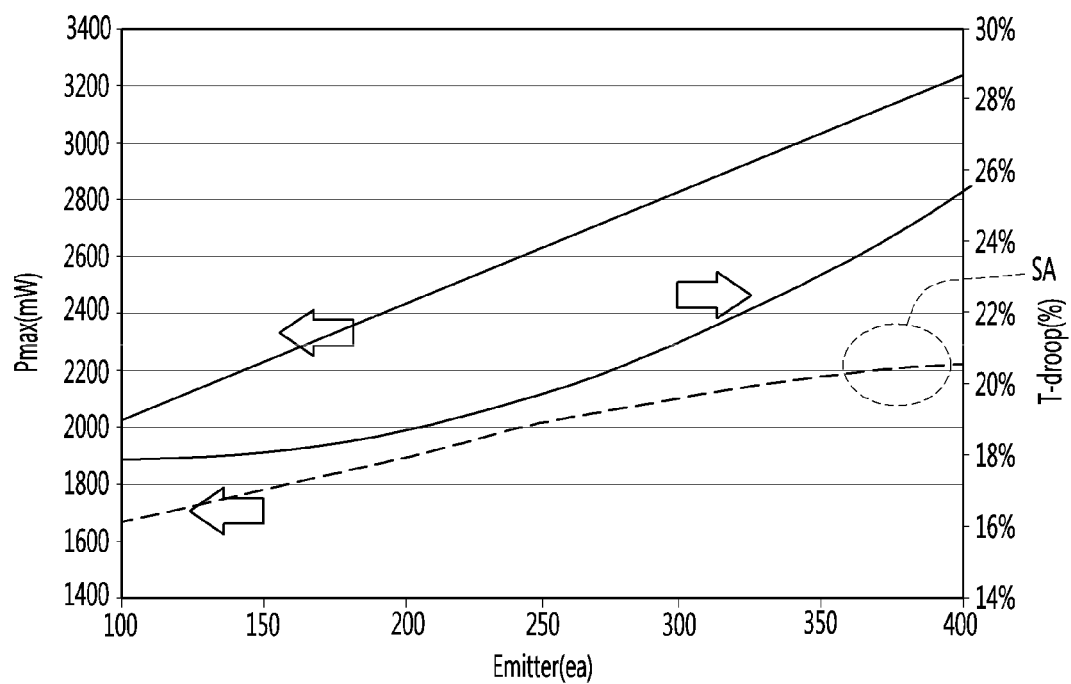

[FIG. 5]
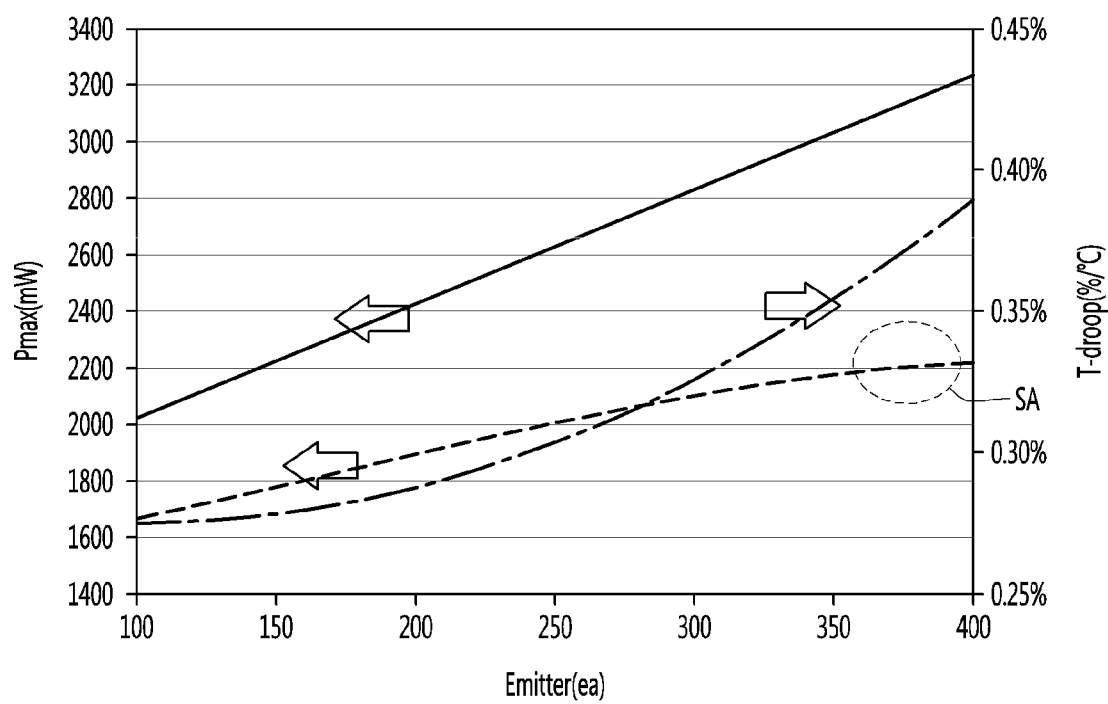

[FIG. 6]
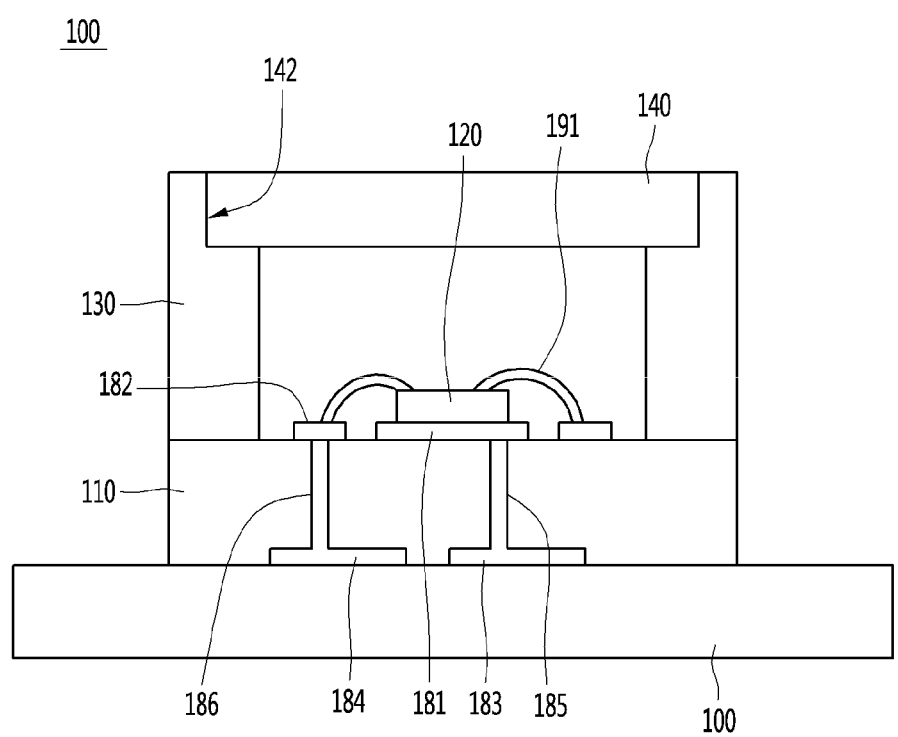

【FIG. 7】
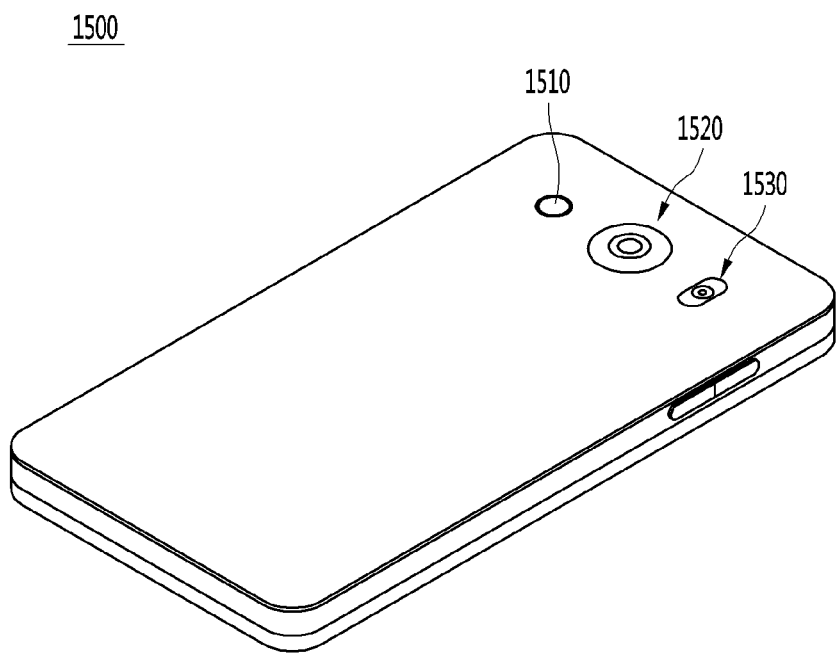

SEMICONDUCTOR DEVICE, SEMICONDUCTOR DEVICE PACKAGE AND AUTO FOCUSING DEVICE

CROSS REFERENCE TO RELATED APPLICATIONS

This application is the National Phase of PCT/KR2018/012407 filed on Oct. 19, 2018, which claims priority under 35 U.S.C. § 119(a) to Patent Application No. 10-2017-0136056 filed in the Republic of Korea on Oct. 19, 2017, all of which are hereby expressly incorporated by reference into the present application.

TECHNICAL FIELD

Embodiments of the present disclosure relates to a semiconductor device, a semiconductor device package, and an auto focusing device.

BACKGROUND ART

A semiconductor device including a compound such as GaN, AlGaN, etc. may have various advantages such as having a wide and easy-to-adjust band gap energy, and thus may be variously used as a light-emitting device, a light-receiving device, and various diodes.

In particular, a semiconductor device such as a light-emitting diode or a laser diode using Group 3-Group 5 or Group 2-Group 6 compound semiconductor material has an advantage in that the device may emit light of various wavelength bands including wavelengths of red, green, blue colors, and UV rays via development of thin film growth technology and device materials.

The semiconductor device includes a plurality of emitters from which light are emitted. A maximum output of the semiconductor device is optimized by adjusting an arrangement of those emitters.

In this connection, a semiconductor device is required to output a high power and to operate at a high voltage as applications thereof are diversified. Therefore, there is an urgent need to optimize an arrangement of emitters to increase the maximum output.

SUMMARY

Embodiments provide a semiconductor device, a semiconductor device package, and an auto focusing device in which an arrangement of emitters is optimized.

Embodiments provide a semiconductor device, a semiconductor device package, and an auto focusing device in which an arrangement of emitters is optimized in consideration of heat (temperature).

Embodiments provide a semiconductor device, a semiconductor device package, and an auto focusing device in which an arrangement of emitters is optimized in consideration of heat (temperature) when the semiconductor device operates.

Embodiments provide a semiconductor device, a semiconductor device package, and an auto focusing device in which a uniform aperture region may be secured in consideration of a spacing between a corner region and an outermost emitter of a mesa region.

A semiconductor device in accordance with one embodiment comprises: a substrate; and a plurality of emitters on the substrate, wherein the emitter includes: a first conductive-type reflective layer having a first reflectance; an active layer on the first conductive-type reflective layer; an aperture layer d on the active layer and including an aperture region and a blocking region surrounding the aperture region; and a second conductive-type reflective layer on the aperture layer and having a second reflectance smaller than the first reflectance. A ratio between a diameter of the aperture region of the aperture layer and a pitch may be in a range of 1:3 to 1:5. The pitch may be defined as a distance between centers of aperture regions of aperture layers of adjacent emitters.

A semiconductor device package in accordance with one embodiment comprises: a second substrate; a semiconductor device on the second substrate; first and second electrodes on the second substrate and electrically connected to the semiconductor device; a housing on the second substrate and disposed around the semiconductor device, wherein the housing has a step in a top thereof; and a diffuser disposed in the step of the housing, and disposed on the semiconductor device, wherein the semiconductor device includes: a first substrate; and a plurality of emitters on the first substrate, wherein the emitter includes: a first conductive-type reflective layer having a first reflectance; an active layer on the first conductive-type reflective layer; an aperture layer on the active layer and including an aperture region and a blocking region surrounding the aperture region; and a second conductive-type reflective layer on the aperture layer and having a second reflectance smaller than the first reflectance. The ratio between a diameter of the aperture region of the aperture layer and a pitch may be in a range of 1:3 to 1:5, wherein the pitch is defined as a distance between centers of aperture regions of aperture layers of adjacent emitters.

An auto focusing device in accordance with one embodiment includes: the semiconductor device package as defined above; and a receiver for receiving light emitted from the semiconductor device package and then reflected from an object.

Advantageous Effects

According to the embodiments, the ratio between a diameter of the aperture region of the aperture layer and a pitch may be in a range of 1:3 to 1:5, wherein the pitch is defined as a distance between centers of aperture regions of aperture layers of adjacent emitters. This may provide an optimal emitter arrangement to obtain the maximum output.

According to the embodiments, the maximum output may be obtained using the optimal arrangement of the emitters with considering the temperature when the semiconductor device is driven.

According to the exemplary embodiments, the optimum emitters arrangement may be achieved, irrespective of the number of the emitters, in the saturated region in which the maximum output is saturated at the temperature when the semiconductor device is driven. This may easily deal with a customer's request.

According to the embodiments, the spacing between the corner region of the mesa region and the outermost emitter is equal to the spacing between adjacent emitters located at the center of the mesa region such that the aperture regions of the emitter located at the center of the mesa region and the outermost emitter may be uniform, thereby to improve the yield of the device.

BRIEF DESCRIPTION OF THE DRAWINGS

FIG. 1 is a plan view showing a semiconductor device according to an embodiment.

FIG. 2 is a cross sectional view of a semiconductor device taken along a line H-H' according to an embodiment.

FIG. 3 illustrates a relationship between emitters in a semiconductor device according to an embodiment.

FIG. 4 and FIG. 5 are graphs showing a maximum output based on the number of emitters.

FIG. 6 is a cross-sectional view showing a semiconductor device package according to an embodiment.

FIG. 7 is a perspective view of a mobile terminal to which an auto focusing device including a semiconductor device package according to an embodiment is applied.

DETAILED DESCRIPTIONS

In descriptions of embodiments, it will be understood that when a first element or layer is referred to as being present "on" or "beneath" a second element or layer, the first element may be disposed directly on or beneath the second element or may be disposed indirectly on or beneath the second element with a third element or layer being disposed between the first and second elements or layers. A spatial term such as "above or "under" may be a relative spatial term. Thus, the terms "above and "under" may be interchanged with each other as appropriate.

Hereinafter, a semiconductor device, a semiconductor device package, and an auto focusing device according to an embodiment will be described in detail with reference to the accompanying drawings.

FIG. 1 is a plan view showing a semiconductor device according to an embodiment. FIG. 2 is a cross-sectional view of a semiconductor device as taken along a line H-H' according to an embodiment.

A semiconductor device 10 according to an embodiment may be a light-emitting diode device or a laser diode device. In one example, the semiconductor device 10 may be a (VCSEL) (Vertical-Cavity Surface-Emitting Laser) semiconductor device. The vertical-cavity surface-emitting laser (VCSEL) semiconductor device may emit a beam in a direction perpendicular to a top face. The vertical-cavity surface-emitting laser (VCSEL) semiconductor device may emit a beam in an upward direction, for example, at a beam angle of view of about 15° to 25°. The vertical-cavity surface-emitting laser (VCSEL) semiconductor device may include a single light-emitting aperture or a plurality of light-emitting apertures that emit a circular beam, that is, a point light source.

Referring to FIGS. 1 and 2, the semiconductor device 10 according to an embodiment may provide a plurality of emitters 20. An emitter may be defined as the smallest unit that emits light. The emitter may be referred to as a cell or unit. The light may be a laser beam in 800 nm to 1500 nm wavelength band, but is not limited thereto. The emitters 20 may be arranged adjacent to each other. The emitters 20 may be spaced apart from each other. The emitter 20 may have a circular shape, but is not limited thereto.

The semiconductor device 10 according to an embodiment may include a light-emitting section and a non-light-emitting section. The light-emitting section may be a region including the plurality of emitters 20. The non-light-emitting section may be an region other than the plurality of emitters.

The semiconductor device 10 according to an embodiment may provide a bonding pad 40. The bonding pad 40 is electrically connected to each emitter 20 so that external power may be supplied to each emitter 20. The bonding pad 40 may be placed in a non-light-emitting section. The bonding pad 40 may be made of a single material selected from a group including Ti, Ru, Rh, Ir, Mg, Zn, Al, In, Ta, Pd, Co, Ni, Si, Ge, Ag, and Au or may be made of an alloy thereof. Further, the bonding pad 40 may be embodied as a single layer or multiple layers.

The bonding pad 40 may be disposed at one side of the semiconductor device 10. The bonding pad 40 may have an elongate bar type extending in one direction.

The semiconductor device 10 according to an embodiment may provide a connector 30. The connector 30 may be placed between emitters 20. The connector 30 may electrically connect the bonding pad 40 to each emitter 20. The connector 30 may be integrally formed with the bonding pad 40. Alternatively, the connector 30 may be formed separately from the bonding pad 40. In this case, the connector 30 may be made of the same metal material as a metal material of the bonding pad 40. However, the present disclosure is not limited thereto. The connector 30 may be made of a single material selected from a group including Ti, Ru, Rh, Ir, Mg, Zn, Al, In, Ta, Pd, Co, Ni, Si, Ge, Ag, and Au or may be made of an alloy thereof. Further, the connector 30 may be embodied as a single layer or multiple layers.

For example, the emitter 20 may be placed in the light-emitting region, while the bonding pad 40 and connector 30 may be placed in the non-light-emitting section. The light-emitting section may occupy 0.5 to 0.8 times of an area of the non-light-emitting section. However, the present disclosure is not limited thereto. When an area of the light-emitting section is greater than 0.5 times of an area of the non-light-emitting section, a predefined optical or electrical characteristic may be obtained. When an area of the light-emitting section is smaller than 0.8 times of an area of the non-light-emitting section, a minimum area for processing the bonding pad may be obtained.

The semiconductor device 10 according to an embodiment may provide a substrate 21. The substrate 21 may include a conductive substrate. The substrate 21 may be made of at least one conductive material selected from a group including copper (Cu), gold (Au), nickel (Ni), molybdenum (Mo), copper-tungsten (Cu—W), and a carrier wafer material (e.g. Si, Ge, AlN, GaAs, ZnO, SiC, etc.) In another example, the substrate 21 may be embodied as a conductive sheet. When the substrate 21 is embodied as a suitable carrier wafer made of GaAs, a light emitting structure 110 may be grown on the substrate 21. In such a case, an adhesive layer 1121 may be omitted.

The semiconductor device 10 according to an embodiment may include a first conductive-type reflective layer 22 disposed on the substrate 21. Specifically, the first conductive-type reflective layer 22 may be disposed on an entire region on the substrate 21. The first conductive-type reflective layer 22 may be made of at least one of group 3-group 5 or group 2-group 6 compound semiconductors. For example, the first conductive-type reflective layer 22 may be made of one selected from a group including GaAs, GaAl, AlGaAs, InP, InAs, GaP. The first conductive-type reflective layer 22 may be made of a semiconductor material having a compositional formula of, for example, $Al_xGa_{1-x}As$ ($0<x<1$)/$Al_yGa_{1-y}As$ ($0<y<1$) ($y<x$). The first conductive-type reflective layer 22 may be formed by alternately arranging different regions, that is, $Al_xGa_{1-x}As$ layers and $Al_yGa_{1-y}As$ layers to achieve a DBR (Distributed Bragg Reflector) structure having a $\lambda/4n$ thickness. The first conductive-type reflective layer 22 may contain a first conductive-type dopant. The first conductive-type dopant may include, for example, Si, Ge, Sn, Se, Te, and the like.

The semiconductor device 10 according to an embodiment may provide an active layer 23. The active layer 23 may be disposed on the first conductive-type reflective layer 22. Specifically, the active layer 23 may be locally disposed on the first conductive-type reflective layer 22. Accordingly, a plurality of active layers 23 may be arranged on the first conductive-type reflective layer 22. The plurality of active layers 23 may be spaced apart from each other. Each of the plurality of active layers 23 may have a circular shape, but is not limited thereto. The active layer 23 may be made of at least one of the groups 3-5 or groups 2-6 compound semiconductors. For example, the active layer 23 may be made of one selected from a group including GaAs, GaAl, AlGaAs, InP, InAs, GaP. The active layer 23 may include a plurality of well layers and a plurality of barrier layers that are alternately arranged with each other. Each of the plurality of well layer may be made of, for example, a semiconductor material having a composition formula of $In_pGa_{1-p}As$ ($0 \le p \le 1$). Each barrier layer may be made of a semiconductor material having a compositional formula of, for example, $In_qGa_{1-q}As$ ($0 \le q \le 1$). The active layer 23 may act to generate light. The light generated in the active layer 23 may be a laser beam having a wavelength range of 800 nm to 1500 nm, but is not limited thereto.

The semiconductor device 10 according to an embodiment may provide an aperture layer 24. The aperture layer 24 may be disposed on the active layer 23. Specifically, the aperture layer 24 may be disposed on an entire region of the active layer 23. The aperture layer 24 may include an aperture region 24a which controls transmission of light generated in the active layer 23, and a blocking region 24b which blocks current flow to allow a current path to be formed in the aperture region 24a. For example, the aperture region 24a may be made of at least one of groups 3-5 or groups 2-6 compound semiconductors. For example, the aperture region 24a may be made of one selected from a group including GaAs, GaAl, AlGaAs, InP, InAs, GaP. The aperture region 24a may be made of, for example, a semiconductor material having a compositional formula of $Al_xGa_{1-x}As$ ($0 < x < 1$). The blocking region 24b may have a ring shape and surround the aperture region 24a. The blocking region 24b may be made of an insulating material such as aluminum oxide (Al oxide). For example, after a semiconductor material having a compositional formula of $Al_xGa_{1-x}As$ ($0 < x < 1$) is grown on the active layer 23 (and subsequently subjected to a mesa etching) and then an oxidation process is performed at about 400° C. to 500° C. in a moisture atmosphere. Thus, the mesa region 60 is selectively oxidized from an outer side thereof to form a ring shaped blocking region 24b.

The mesa region 60 may be a region in which a second conductive-type reflective layer 26, the aperture layer 24 and the active layer 23 are locally removed. The mesa region 60 may include the plurality of emitters 20a and regions between the plurality of emitters 20.

Although not shown, the blocking region 24b may be disposed between the first conductive-type reflective layer 22 and the active layer 23. The blocking region 24b may guide the light generated in the active layer 23 to resonate. The blocking region 24b may be made of at least one of group 3-group 5 or group 2-group 6 compound semiconductors. For example, the blocking region 24b may be made of one selected from a group including GaAs, GaAl, AlGaAs, InP, InAs, GaP.

The semiconductor device 10 according to an embodiment may provide the second conductive-type reflective layer 26. Specifically, the second conductive-type reflective layer 26 may be disposed on an entire region of the aperture layer 24. The second conductive-type reflective layer 26 may be made of at least one of group 3-group 5 or group 2-group 6 compound semiconductors. For example, the second conductive-type reflective layer 26 may be made of one selected from a group including GaAs, GaAl, AlGaAs, InP, InAs, GaP. The second conductive-type reflective layer 26 may be made of a semiconductor material having a compositional formula of, for example, $Al_xGa_{1-x}As$ ($0 < x < 1$)/$Al_yGa_{1-y}As$ ($0 < y < 1$) ($y < x$). The second conductive-type reflective layer 26 may be formed by alternately arranging different regions, that is, $Al_xGa_{1-x}As$ layers and $Al_yGa_{1-y}As$ layers to achieve a DBR (Distributed Bragg Reflector) structure having a λ/4n thickness. The second conductive-type reflective layer 26 may contain a second conductive-type dopant. The second conductive-type dopant may include, for example, Mg, Zn, Ca, Sr, and Ba.

A reflectance of the second conductive-type reflective layer 26 may be smaller than that of the first conductive-type reflective layer 22. For example, the first conductive-type reflective layer 22 may have a reflectance of at least 93%. For example, the second conductive-type reflective layer 26 may have a reflectance of at least 90%. Accordingly, the light generated in the active layer 23 may be emitted to the outside through the second conductive-type reflective layer 26 having the reflectance smaller than the reflectance of the first conductive-type reflective layer 22.

The first conductive-type reflective layer 22 may be disposed on an entire region of the substrate 21, while the active layer 23, aperture layer 24 and second conductive-type reflective layer 26 may be disposed locally on the substrate. That is, the active layers 23 may be spaced apart from each other on the substrate 21. The aperture layers 24 may be spaced apart from each other on the substrate 21. The second conductive-type reflective layers 26 may be spaced apart from each other on the substrate 21.

For this purpose, a photolithography process and a mesa etching process may be performed.

Specifically, the first conductive-type reflective layer 22, active layer 23, aperture layer 24 and second conductive-type reflective layer 26 may be vertically sequentially grown on the substrate 21. The first conductive-type reflective layer 22, active layer 23, aperture layer 24 and second conductive-type reflective layer 26 may be grown using EBD (electron beam deposition), PVD (physical vapor deposition), CVD (chemical vapor deposition), PLD (plasma laser deposition), DTTE (dual-type thermal evaporating), sputtering or MOCVD (metal organic chemical vapor deposition). Each of the first conductive-type reflective layer 22, the active layer 23, the aperture layer 24, and the second conductive-type reflective layer 26 may be made of at least one of the group 3-5 or 2-6 compound semiconductors.

Thereafter, a photolithography process and an etching process may be performed to form a mesa region 60 in which the second conductive-type reflective layer 26, the aperture layer 24, and the active layer 23 are locally etched and removed. Accordingly, as described above, a plurality of second conductive-type reflective layers spaced apart from each other 26, aperture layers spaced apart from each other 24, and a plurality of active layers 23 spaced apart from each other may be formed. A side face of each of the active layer 23, aperture layer 24 and second conductive-type reflective layer 26 may be inclined relative to a top face of the first conductive-type reflective layer 22. Thus, a size of the aperture layer 24 may be smaller than a size of the active layer 23. A size of the second conductive-type reflective layer 26 may be smaller than a size of aperture layer 24.

Thereafter, as described above, the oxidation process proceeds at approximately 400° C. to 500° C. in a water atmosphere, the oxidation may be selectively executed from an outer face of the aperture layer 24 to form a ring-shaped blocking region 24b.

In one example, to improve a product yield, it is necessary to keep sizes of the aperture regions 24a of the aperture layers 24 of the plurality of emitters 20 to be uniform. As mentioned above, a size of the aperture region 24a of the aperture layer 24 is determined by the blocking region 24b formed by selective oxidation.

However, since a corner region of a mesa region is angled in the prior art, a spacing between the outermost emitter and a corner region of the mesa region is much larger than a spacing between adjacent emitters. As a result, more moisture is present in the corner region of the mesa region and the outermost emitter than in the spacing between the adjacent emitters. Thus, the moisture may penetrate more into the aperture layer. Thus, the aperture region of the aperture layer of the outermost emitter may be different from the aperture region of the aperture layer of the emitter located at the center of the mesa region 60.

According to an embodiment, as shown in FIG. 1, the corner region 62 of the mesa region 60 may have a round shape. This reduces a spacing L between the outermost emitter and the corner region 62 of the mesa region 60. Thus, both the outermost emitter and the emitter positioned at the center of the mesa region 60 may have the same or similar sized aperture regions.

For example, the spacing L between the outermost emitter and the corner region 62 of the mesa region 60 may be the same as a spacing between adjacent emitters located at the center of the mesa region 60.

Specifically, the spacing L between the outermost emitter and the corner region 62 of the mesa region may be in a range of 5 μm to 9 μm, but is not limited thereto.

For example, the round shape of the corner region 62 of the mesa region 60 may correspond to a round shape of the outermost emitter.

The semiconductor device 10 according to an embodiment may provide an insulating layer 27. The insulating layer 27 may electrically insulate the first conductive-type reflective layer 22, active layer 23, aperture layer 24, and second conductive-type reflective layer 26 from a second electrode 28 and the connector 30 to be subsequently formed.

The insulating layer 27 may be disposed on a locally exposed top face of the first conductive-type reflective layer 22. The insulating layer 27 may be disposed on a side face of the active layer 23, a side face of the aperture layer 24 and a side face of the second conductive-type reflective layer 26.

The insulating layer 27 may be disposed on the top face of the second conductive-type reflective layer 26. In one example, as shown in FIG. 2, the insulating layer 27 may extend along an edge of the second conductive-type reflective layer 26. When viewed from above, the insulating layer 27 may extend in a ring shape on the second conductive-type reflective layer 26. In another example, the insulating layer 27 may be disposed on an entire region of the top face of the second conductive-type reflective layer 26, except for in a contact region in which the second electrode 28 is in electrical contact with the second conductive-type reflective layer 26. That is, the insulating layer 27 may be formed in the entire region of the top face of the second conductive-type reflective layer 26, while the second electrode 28 may pass through the insulating layer 27 locally on the insulating layer 27 and thus may be electrically connected to the second conductive-type reflective layer 26.

The insulating layer 27 may be made of an insulating material or insulating resin such as an oxide, nitride, fluoride, and sulfide of a material selected from a group including Al, Cr, Si, Ti, Zn, and Zr. The insulating layer 27 may be made of at least one inorganic material selected from a group including, for example, $SiO_2$, $Si_3N_4$, $Al_2O_3$, and $TiO_2$. The insulating layer 27 may be made of an organic material such as epoxy, polyimide, perfluorocyclobutane, benzocyclobutene (BCB). The insulating layer 27 may be embodied as a single layer or multiple layers.

The semiconductor device 10 according to an embodiment may provide the second electrode 28. The second electrode 28 may be disposed on the insulating layer 27. In detail, the second electrode 28 may be disposed on an entire region of the insulating layer 27. The second electrode 28 may be disposed to cover at least the insulating layer 27 and on the second conductive-type reflective layer 26. That is, a first region of the second electrode 28 may cover the insulating layer 27 disposed along an edge of the second conductive-type reflective layer 26, while a second region of the second electrode 28 may extend from the first region and be disposed on a partial region of a top face of the second conductive-type reflective layer 26 via an inner face of the insulating layer 27. The second electrode 28 may be electrically connected with a partial region of the second conductive-type reflective layer 26. The second electrode 28 may have a ring shape when viewed from above the second conductive-type reflective layer 26, as shown in FIGS. 1 and 3. In this case, a light-emitting region RA may be defined by a region of the top face of the second conductive-type reflective layer 26 as not covered by the second electrode 28. In such a case, a size of the light-emitting region RA may be larger than a size of the aperture region 24a. The size of the light-emitting region RA may be determined based on a distance between the top face of the second conductive-type reflective layer and a top face of the aperture region 24a of the aperture layer 24 or an angle of view (AOV) of light.

The aperture region 24a may act to generate a laser beam as a point light source. The light-emitting region RA may act to control an angle of view (AOV) at which light is finally emitted. Thus, a diameter of the laser beam as the point light source may be adjusted by the aperture region 24a. The angle of view (AOV) of light emitted from the semiconductor device 10 may be controlled by the light-emitting region RA.

The diameter of the aperture region 24a may be defined as D1. The diameter of the light-emitting region RA may be defined as D2. The diameter D2 of the light-emitting region RA may be larger than the diameter D1 of the aperture region 24a.

The second electrode 28 may be made of a single material selected from a group including Ti, Ru, Rh, Ir, Mg, Zn, Al, In, Ta, Pd, Co, Ni, Si, Ge, Ag, Au or may be made of alloy thereof. Further, the second electrode 28 may be embodied as a single layer or multiple layers.

The semiconductor device 10 according to an embodiment may provide a first electrode 29. The first electrode 29 may be disposed below the substrate 21. Specifically, the first electrode 29 may be disposed on an entire region of substrate 21. The first electrode 29 may be made of a single material selected from a group including Ti, Ru, Rh, Ir, Mg, Zn, Al, In, Ta, Pd, Co, Ni, Si, Ge, Ag, Au or an alloy thereof. Further, the first electrode 29 may be embodied as a single layer or multiple layers.

When power is applied to the first electrode 29 and the second electrode 28 of the semiconductor device 10 configured as described above, light may be generated in the active layer 23, and the generated light may travel in an upward direction and a downward direction. The light propagated in the downward direction may be referred as first light, while the light propagated in the upward direction may be referred to as second light. The first light may be reflected by the first conductive-type reflective layer 22 and then may travel toward the active layer 23, while the second light may be reflected by the second conductive-type reflective layer 26 and then may be directed toward the active layer 23. In this manner, light may resonate while continuously traveling back and forth between the active layer 23 and the first conductive-type reflective layer 22 or between the active layer 23 and the second conductive-type reflective layer 26. Further, light may resonate by a guide layer of the aperture layer 24.

When the light resonates in this manner and thus is amplified and passes over a threshold, the light may pass through the second conductive-type reflective layer 26 having a reflectance smaller than that of the first conductive-type reflective layer 22 and thus may be emitted to an outside. In this connection, a diameter of a circular light source as the laser beam may be controlled by the aperture region 24a of the aperture layer 24, while an angle of view (AOV) of the laser beam may be controlled by the light-emitting region RA defined by the ring-shaped second electrode 28.

A combination of the substrate 21 and first electrode 29 may be referred to as a first electrode unit, while a combination of the bonding pad 40, connector 30 and second electrode 28 may be referred to as a second electrode unit. Further, the active layer 23 and aperture layer 24 may be referred to as a light-emitting section. In addition, the first conductive-type reflective layer 22, the light-emitting section and the second conductive-type reflective layer 26 may be referred to as a light emitting structure.

In the semiconductor device 10 according to an embodiment, the first conductive-type reflective layer may be commonly connected to the plurality of emitters 20, and thus heat-dissipation may be more easily achieved.

Further, the first electrode 29 may be placed across the entire region of the substrate 21 and below the substrate 21 and may be commonly connected to the plurality of emitters 20. The second electrode 28 may be commonly connected to the emitters 20 using the connector 30. Thus, the semiconductor device 10 may be easily driven by collectively driving all of the emitters 20 using the same power source.

In one example, as described above, the semiconductor device according to an embodiment may include the plurality of emitters 20. As the number of the emitters 20 included in the semiconductor device increases, a maximum output may increase.

When the number of the emitters 20 increases, a pitch P may decrease as shown in FIG. 1 and FIG. 2. The pitch P may be defined as a spacing between a center of the aperture region 24a of the aperture layer 24 of a first emitter 20a and a center of the aperture region 24a of the aperture layer 24 of a second emitter 20b. Alternatively, the pitch P may be defined as a spacing between a center of the light-emitting region RA of the first emitter 20a and a center of the light-emitting region RA of a second emitter 20b. Alternatively, the pitch P may be defined as a spacing between a center of the first emitter 20a and a center of the second emitter 20b. The light-emitting region RA may be defined by a region of the top face of the second conductive-type reflective layer 26 as not covered by the second electrode 28.

In this case, the center of the aperture region 24a of the aperture layer 24 of the first emitter 20a, the center of the light-emitting region RA of the first emitter 20a and the center of the first emitter 20a may coincide with each other vertically. The center of the aperture region 24a of the aperture layer 24 of the second emitter 20b, the center of the light-emitting region RA of the second emitter 20b, and the center of the second emitter 20b may coincide with each other vertically.

For example, a relationship between the number of the emitters 20 and the pitch P may be represented as shown in Table 1. A size of the semiconductor device may be fixed and a size of each emitter may be the same. However, the present disclosure is not limited thereto.

TABLE 1

| NO | Number of emitters | P (μm) |
|---|---|---|
| Case #1 | 384 | 42 |
| Case #2 | 372 | 43.5 |
| Case #3 | 345 | 45 |
| Case #4 | 308 | 46.5 |
| Case #5 | 294 | 48 |
| Case #6 | 270 | 51 |
| Case #7 | 238 | 54 |
| Case #8 | 216 | 57 |

As shown in Table 1, for example, when the number of the emitters 20 is 216 (Case #8), the pitch P is 57 μm. When the number of the emitters 20 is increased to 384 (Case #1), the pitch P may be reduced to 42 μm, and a maximum output Pmax may be increased.

In one example, the maximum output may increase linearly as the number of the emitters 20 increases, that is, as the pitch P decreases at room temperature 25° C.

However, when a temperature of the semiconductor device 10 is higher than the room temperature, as the pitch P decreases, the maximum output may increase linearly and then become saturated.

The semiconductor device may be applied to an application field such as a proximity sensor or an auto focusing device. When the semiconductor device 10 is driven in such an application field, the temperature of the semiconductor device 10 may be increased to 65° C.

In an embodiment, a relationship between the pitch P and the maximum output may be optimized when the semiconductor device 10 is driven at a temperature of 65° C.

FIG. 4 and FIG. 5 are graphs showing a maximum output based on the number of the emitters. A T-droop shown on a right side of FIG. 5 may be a value (%/° C.) obtained by dividing a T-droop value % of FIG. 4 by the temperature of 65° C. T-droops in FIG. 4 and FIG. 5 show the same characteristic distribution.

In FIG. 4 and FIG. 5, a highlight line shows a maximum output Pmax based on the number of emitters 20 at room temperature. A dashed line shows the maximum output Pmax based on the number of the emitters 20 at a temperature higher than the room temperature, such as 65° C. 65° C. may be a temperature due to heat generated by driving the semiconductor device 10. The T-droop may represent a rate at which the maximum output Pmax is reduced at 65° C. compared to the room temperature.

As shown in FIG. 4 and FIG. 5, the maximum output Pmax may increase linearly as the number of emitters 20 increases at the room temperature.

However, at a temperature above the room temperature, for example, at 65° C. as a temperature at which the semiconductor device is driven, the maximum output Pmax increases linearly as the number of emitters 20 increases.

However, in a specific region, even when the number of emitters 20 increases, the maximum output Pmax may not increase but may be saturated. The specific region may be a saturated region SA. The number of emitters 20 may be in a range of 360 to 400 to obtain the maximum output Pmax in the saturated region SA.

A reason why the maximum output Pmax has the saturated region SA is estimated to be due to the heat generated in the semiconductor device 10. That is, when the semiconductor device 10 is driven and the temperature is increased to 65° C., the number of emitters is relatively small, a distance between the emitters is relatively larger, and, thus, the heat dissipating may be easy, Thus, the maximum output Pmax may be increased even when the number of emitters increases. However, in a case where the number of emitters is further increased to reach the saturated region SA, a distance between adjacent emitters is very small, and, thus, the heat dissipation may be difficult. Thus, the maximum output Pmax does not increase.

Therefore, it is very important to optimize an arrangement of the emitters 20 when the saturated region SA in which the maximum output Pmax at 65° C. no longer increases and is saturated is present.

As shown in FIG. 2, FIG. 4 and FIG. 5, the pitch P between the emitters 20 included in the saturated region SA may be in a range of 40 μm to 45 μm. The pitch P may be defined as one of a distance between the centers of the aperture regions 24a of the aperture layers 24 of the adjacent emitters 20, a distance between the centers of adjacent light-emitting regions RA, and a distance between centers of adjacent emitters 20. When the pitch P is 40 micrometers or smaller, a distance between the first and second emitters 20a and 20b is too small, and a process is difficult. When the pitch P is larger than 45 μm, the distance between the emitters 20a and 20b is larger and thus the maximum output Pmax is reduced. Specifically, the pitch P between the emitters 20 included in the saturated region SA may be in a range of 42 μm to 44 μm.

In one example, a ratio between the diameter D1 of the aperture region 24a of the aperture layer 24 and the pitch P may be 1:3 to 1:5. As mentioned above, the pitch P may be in a range of 40 micrometers to 45 micrometers. In this case, the diameter D1 of the aperture region 24a of the aperture layer 24 may be in a range of 9 μm to 13 μm. When the ratio between the pitch P and the diameter D1 of the aperture region 24a of the aperture layer 24 is smaller than 1:3, the distance between the emitters 20a and 20b is so small that the process is difficult. When the ratio between the pitch P and the diameter D1 of the aperture region 24a of the aperture layer 24 is greater than 1:5, the distance between the emitters 20a and 20b is larger to reduce the maximum output Pmax.

Specifically, the ratio between the pitch P and the diameter D1 of the aperture region 24a of the aperture layer 24 may be in a range of 1:3.75 to 1:4. In this case, the diameter D1 of the aperture region 24a of the aperture layer 24 may be in a range of 10 μm to 12 μm.

In one example, when the temperature at the time of driving the semiconductor device 10 is higher than 65° C., the saturated region SA of the maximum output Pmax may correspond to an arrangement of the emitters where the number of the emitters is smaller than the number of emitters in the saturated region SA shown in FIGS. 4 and 5. However, the present disclosure is not limited thereto.

FIG. 6 is a cross-sectional view showing a semiconductor device package according to an embodiment.

Referring to FIG. 6, the semiconductor device package 100 according to an embodiment may include a substrate 110 and a semiconductor device 120 disposed on the substrate 110.

The substrate 110 may include a material with high thermal conductivity. The substrate 110 may be made of a material having good heat dissipation so that heat generated from the semiconductor device 120 may be efficiently emitted to an outside. The substrate 110 may include an insulating material.

For example, the substrate 110 may include a ceramic material. The substrate 110 may include LTCC (low temperature co-fired ceramic) or HTCC (high temperature co-fired ceramic).

Further, the substrate 110 may include a metal compound. The substrate 110 may include a metal oxide having thermal conductivity of 140 W/mK or greater. For example, the substrate 110 may include aluminum nitride AlN or alumina $Al_2O_3$.

In another example, the substrate 110 may include a resin-based insulating material. The substrate 110 may be made of a silicone resin, an epoxy resin, a thermosetting resin including a plastic material, or a high heat resistant material.

The substrate 110 may include a conductive material. When the substrate 110 is made of a conductive material, such as a metal, an insulating layer 27 may be provided for electrical insulation between the substrate 110 and the semiconductor device 120.

The semiconductor device 120 according to an embodiment may be selected from light emitting devices including light-emitting diode devices and laser diode devices. In one example, the semiconductor device 120 may be a vertical-cavity surface-emitting laser (VCSEL) semiconductor device. The vertical-cavity surface-emitting laser (VCSEL) semiconductor device may emit a beam in a direction perpendicular to a top face. The vertical-cavity surface-emitting laser (VCSEL) semiconductor device may emit a beam in an upward direction, for example, at a beam angle of view (AOV) of about 15° to 25°. The vertical-cavity surface-emitting laser (VCSEL) semiconductor devices may include a single light-emitting aperture or a plurality of light-emitting apertures that emit a circular beam. An example of the vertical-cavity surface-emitting laser (VCSEL) semiconductor device will be described later.

The semiconductor device package 100 according to an embodiment may further include a housing 130. The housing 130 may be disposed over the substrate 110. The housing 130 may be disposed around the semiconductor device 120.

The housing 130 may include a material with high thermal conductivity. The housing 130 may be made of a material having good heat dissipation so that the heat generated by the semiconductor device 120 may be efficiently discharged to the outside. The housing 130 may include an insulating material.

For example, the housing 130 may include a ceramic material. The housing 130 may include LTCC (low temperature co-fired ceramic) or HTCC (high temperature co-fired ceramic).

Further, the housing 130 may include a metal compound. The housing 130 may include a metal oxide having a thermal conductivity of 140 W/mK or greater. For example, the housing 130 may include aluminum nitride AlN or alumina $Al_2O_3$.

In another example, the housing 130 may include a resin-based insulating material. The housing 130 may be made of a silicone resin, an epoxy resin, a thermosetting resin including a plastic material, or a high heat resistant material.

The housing 130 may include a conductive material. The housing 130 may be made of a conductive material, such as a metal.

In one example, the housing 130 may include the same material as that of the substrate 110. When the housing 130 is made of the same material as that of the substrate 110, the housing 130 may be integrally formed with the substrate 110.

Further, the housing 130 may be made of a different material than that of the substrate 110.

According to the semiconductor device package 100 according to an embodiment, the substrate 110 and the housing 130 may be made of a material having excellent heat dissipation characteristics. Accordingly, the heat generated by the semiconductor device 120 may be effectively discharged to the outside.

According to an embodiment, when the substrate 110 and the housing 130 are provided as separate components and then are coupled to each other, an adhesive layer may be provided between the substrate 110 and the housing 130.

In one example, the adhesive layer may include an organic material. The adhesive layer may include an epoxy-based resin. Further, the adhesive layer may include a silicone-based resin.

The semiconductor device package 100 including the substrate 110 and the housing 130 may be manufactured by, for example, a wafer level package process. That is, the semiconductor device 120 and the housing 130 may be attached on the substrate 110 at a wafer level. A plurality of semiconductor device packages may be provided by a cutting method by dicing. In each package, the semiconductor device 120 and the housing 130 are coupled to the substrate 110.

When the semiconductor device package 100 including the substrate 110 and the housing 130 is manufactured by a wafer level package process, an outer face of the substrate 110 and an outer face of the housing 130 may be flush with each other. That is, there is no step between the outer face of the substrate 110 and the outer face of the housing 130.

According to an embodiment, since there is no step between the outer face of the substrate 110 and the outer face of the housing 130, defects caused by damage due to moisture permeation and external friction due to a stepped structure in a conventional semiconductor device package may be fundamentally prevented.

The substrate 110 may be referred to as a first substrate, while the housing 130 may be referred to as a second substrate. Alternatively, substrate 110 may be referred to as a first body, while the housing 130 may be referred to as a second body.

The semiconductor device package 100 according to an embodiment may further include a first electrode 181 and a second electrode 182 disposed on the substrate 110. The first electrode 181 and the second electrode 182 may be spaced apart from each other on the substrate 110.

In one example, the semiconductor device 120 may be disposed on the first electrode 181. The semiconductor device 120 may be provided on the first electrode 181 by, for example, a die bonding method. The semiconductor device 120 may be electrically connected to the second electrode 182. In one example, the semiconductor device 120 and the second electrode 182 may be electrically connected to each other by a wire 191. The semiconductor device 120 may be electrically connected to the second electrode 182 via a plurality of wires. The semiconductor device 120 may be electrically connected to the second electrode 182 via a wire 191.

The number and connection positions of the wires connecting the semiconductor device 120 and the second electrode 182 may be selected based on a size of the semiconductor device 120 or a degree of current spreading required in the semiconductor device 120.

The semiconductor device package 100 according to an embodiment may include a first bonding section 183 and a second bonding section 184 disposed under the substrate 110. In one example, the first bonding section 183 and second bonding section 184 may be electrically connected to a signal line (not shown) of a circuit substrate 160.

The substrate 110 may be referred to as a first substrate, while a circuit substrate 160 may be referred to as a second substrate. Conversely, the circuit substrate 160 may be referred to as a first substrate while the substrate 110 may be referred to as a second substrate. The housing 130 may be referred to as a third substrate.

The first bonding section 183 and the second bonding section 184 may be spaced apart from each other under the substrate 110. Each of the first bonding section 183 and the second bonding section 184 may have a circular pad, but may not be limited thereto.

The first bonding section 183 may be placed on a bottom face of the substrate 110. The first bonding section 183 may be electrically connected to the first electrode 181. The first bonding section 183 may be electrically connected to the first electrode 181 via a first connecting wire 185. In one example, the first connecting wire 185 may be disposed in a first via hole defined in the substrate 110.

The second bonding section 184 may be disposed on the bottom face of the substrate 110. The second bonding section 184 may be electrically connected to the second electrode 182. The second bonding section 184 may be electrically connected to the second electrode 182 via a second connecting wire 186. In one example, the second connecting wire 186 may be disposed in a second via hole defined in the substrate 110.

For example, each of the first connecting wire 185 and the second connecting wire 186 may include tungsten W, but may not be limited thereto. Tungsten W may be melted at a high temperature of 1000° C. or higher, and then injected into the first and second via holes, and then cured to form the first connecting wire 185 and the second connecting wire 186 respectively.

According to an embodiment, a driving power may be provided to the semiconductor device 120 via the circuit substrate 160.

The semiconductor device package 100 according to the above-described embodiment has been described based on a case in which the semiconductor device 120 is connected to the first electrode 181 via a die bonding scheme, and is connected to the second electrode 182 via a wire-bonding scheme.

However, a method of supplying the driving power to the semiconductor device 120 may be variously modified and applied. In one example, the semiconductor device 120 may be electrically connected to the first electrode 181 and the second electrode 182 using a flip chip bonding scheme. Further, the semiconductor device 120 may be electrically connected to both the first electrode 181 and the second electrode 182 via the wire bonding scheme.

In one example, a step may be provided in a top region of the housing 130. For example, a recess region 142 may be provided in a top region of the housing 130. In one example, a width and/or depth of the recess region 142 may be in a range of hundreds of micrometers.

A diffuser 140 may be disposed in the recess region 142. The diffuser 140 may be supported in the recess region 142 provided on the top of the housing 130.

An adhesive layer (not shown) may be provided between the housing 130 and the diffuser 140 in the recess region 142. In one example, the adhesive layer may be provided on a bottom face and a side face of the diffuser 140 abutting an inner face of the recess region 142.

The semiconductor device package 100 according to an embodiment may further include the diffuser 140. The diffuser 140 may be disposed on the semiconductor device 120. The diffuser 140 may be spaced apart from the semiconductor device 120. The diffuser 140 may be disposed in a top of the housing 130. Specifically, the diffuser 140 may be seated in the recess region 142 of the housing 130. The diffuser 140 may be supported by the recess region 142 of the housing 130.

The diffuser 140 may extend a beam angle of view (AOV) of light emitted from the semiconductor device 120. The diffuser 140 may include, for example, a micro lens, a concave-convex pattern, and the like. The micro lens, a concave-convex pattern, or the like may be disposed on a top face or a bottom face of the diffuser 140. The micro lens, the concave-convex pattern, or the like may be formed integrally with the diffuser 140 or may be separately formed therewith.

The diffuser 140 may vary an angle of view (AOV) of the beam based on an application field of the semiconductor device package 100. The diffuser 140 may vary the light intensity based on the application field of the semiconductor device package 100.

The diffuser 140 may have an anti-reflective function. In one example, the diffuser 140 may include an anti-reflective layer disposed on one face thereof facing the semiconductor device 120. The anti-reflective layer may be formed separately from the diffuser 140. The diffuser 140 may include an anti-reflective layer disposed on a bottom face thereof facing the semiconductor device 120. The anti-reflective layer may prevent light incident from the semiconductor device 120 from being reflected from a surface of the diffuser 140 but may allow transmittance thereof into the diffuser 140, thereby to reduce light loss due to reflection.

In one example, the anti-reflective layer may be formed of an anti-reflective coating film attached to the surface of the diffuser 140. The anti-reflective layer may be formed on the surface of the diffuser 140 using a spin coating or spray coating. In one example, the anti-reflective layer may be formed of a single layer or multiple layers including at least one selected from a group including $TiO_2$, $SiO_2$, $Al_2O_3$, $Ta_2O_3$, $ZrO_2$, $MgF_2$.

The semiconductor device package 100 according to an embodiment may further include the adhesive layer provided between the diffuser 140 and the recess region 142 of the housing 130. In one example, the adhesive layer may include organic material. The adhesive layer may include an epoxy resin. Further, the adhesive layer may include a silicone resin.

In one example, as described above, the substrate 110 and the housing 130 may be manufactured by a wafer level package process. According to an embodiment, the diffuser 140 may be attached onto the housing 130 by the wafer level package process.

That is, the semiconductor device 120 and the housing 130 may be attached on the substrate 110 at a wafer level. After the diffuser 140 is attached on the housing 130, a plurality of semiconductor device packages in which each package has the semiconductor device 120, the housing 130, and the diffuser 140 coupled to the substrate 110 may be provided by a cutting method including dicing.

When the semiconductor device package 100 including the substrate 110, the housing 130, and the diffuser 140 is manufactured by a wafer level package process, the outer face of the substrate 110, the outer face of the housing 130, and the outer face of the diffuser 140 may be flush with each other. That is, there is no step between the outer face of the substrate 110, the outer face of the housing 130, and the outer face of the diffuser 140.

The semiconductor device package 100 according to an embodiment may further include a circuit substrate 160 including at least one or more signal lines. For example, the circuit substrate 180 includes first and second signal lines. The first bonding section 183 and second bonding section 184 may be electrically connected to the first signal line and the second signal line respectively.

According to an embodiment, since there is no step between the outer face of the substrate 110, the outer face of the housing 130, and the outer face of the diffuser 140, a defect caused from damage occurring due to moisture permeation and external friction due to a step structure in a conventional semiconductor device package may be fundamentally eliminated.

According to an embodiment, the substrate 110 and the housing 130 may be fabricated in a wafer level package process. The diffuser 140 may be attached onto the housing 130 in a separate process.

According to an embodiment, the diffuser 140 may be stably fixed to the housing 130 using the adhesive layer provided between the diffuser 140 and the recess region 142 of the housing 130.

In one example, the semiconductor device package 100 according to an embodiment as described above may be applied to a proximity sensor, an auto focusing device, or the like. For example, the auto focusing device according to an embodiment may include a light-emitter for emitting light and a receiver for receiving light. An example of the light-emitter may include at least one of the semiconductor device packages 100 according to an embodiment as described with reference to FIG. 6. An example of the receiver may include a photodiode. The receiver may receive light that is emitted from the light-emitter and then reflected from an object.

The auto focusing device may be variously applied to a mobile terminal, a camera, a vehicle sensor, and an optical communication device. The auto focusing device may be applied to various fields for multi-position detection for detecting a position of a subject.

FIG. 7 is a perspective view of a mobile terminal to which an auto focusing device including a semiconductor device package according to an embodiment is applied.

As illustrated in FIG. 7, a mobile terminal 1500 in this embodiment may include a camera module 1520, a flash module 1530, and an auto focusing device 1510 provided on a rear face thereon. In this connection, the auto focusing device 1510 may include one of the semiconductor device packages 100 according to an embodiment as described with reference to FIG. 6 as a light-emitter.

The flash module 1530 may include a light emitting device that emits light therein. The flash module 1530 may be activated upon camera operation of the mobile terminal or control of a user thereof. The camera module 1520 may include an image capturing function and an auto focus function. For example, the camera module 1520 may include an auto focus function using an image.

The auto focusing device 1510 may include an auto focusing function using a laser. The auto focusing device 1510 may be mainly used in a condition in which the auto focus function using the image of the camera module 1520 is degraded, for example, in a proximity environment of 10 m or shorter or a dark environment. The auto focusing device 1510 may include a light-emitter including a vertical-cavity surface-emitting laser (VCSEL) semiconductor device and a receiver such as a photodiode to convert light energy into electrical energy.

Features, structures, effects, etc. described in the above embodiments are included in at least one embodiment and are not necessarily limited to a single embodiment. Furthermore, the features, structures, effects, and the like illustrated in each embodiment may be implemented in a combined or modified manner with respect to other embodiments by those skilled in the art to which the embodiments belong. Therefore, contents related to such combinations and modifications should be interpreted as being included within a scope of the embodiments.

The present disclosure has been described above based on the embodiments. Those embodiments are merely examples and the present disclosure is not limited to the embodiments. Those skilled in the art will appreciate that various modifications and applications as not illustrated above are possible without departing from the essential characteristics of the present disclosure. For example, each component specifically shown in each embodiment may be modified. Differences related to such modifications and applications should be construed as being included within the scope of the present disclosure as set in the appended claims.

An embodiment may be applied to, for example, a proximity sensor, an auto focusing device, or the like.

An auto focusing device may be variously applied to a mobile terminal, a camera, a vehicle sensor, and an optical communication device. The auto focusing device may be applied to various fields for multi-position detection for detecting a position of a subject.

What is claimed is:

1. A semiconductor device comprising:
   a substrate; and
   a plurality of emitters on the substrate,
   wherein the emitter includes:
   a first conductive-type reflective layer having a first reflectance;
   an active layer on the first conductive-type reflective layer;
   an aperture layer on the active layer and including an aperture region and a blocking region surrounding the aperture region; and
   a second conductive-type reflective layer on the aperture layer and having a second reflectance smaller than the first reflectance,
   wherein a ratio between a diameter of the aperture region of the aperture layer and a pitch is in a range of 1:3 to 1:5,
   wherein the pitch is defined as a distance between centers of aperture regions of aperture layers of adjacent emitters
   wherein the device has a saturated region in which a maximum output at a temperature higher than a room temperature is saturated, and
   wherein the maximum output in the saturated region is obtained in the ratio of diameter of the aperture region of the aperture layer and the pitch.

2. The semiconductor device of claim 1, wherein the first conductive-type reflective layer is commonly connected to the plurality of emitters.

3. The semiconductor device of claim 1, further comprising:
   a first electrode disposed below the first conductive-type reflective layer; and
   a second electrode disposed along an edge of the second conductive-type reflective layer.

4. The semiconductor device of claim 3, wherein the second electrode is commonly connected to the plurality of emitters.

5. The semiconductor device of claim 4, further comprising:
   a connector disposed between adjacent emitters; and
   a bonding pad spaced apart from the plurality of emitters and connected to the connector.

6. The semiconductor device of claim 1, wherein the temperature higher than the room temperature is a temperature when the semiconductor device is driven.

7. The semiconductor device of claim 1, wherein the pitch is in a range of 40 μm to 45 μm.

8. The semiconductor device of claim 1, wherein the diameter of the aperture region of the aperture layer is in a range of 9 μm to 13 μm.

9. The semiconductor device of claim 1, wherein the ratio between the diameter of the aperture region of the aperture layer and the pitch is in a range of 1:3.75 to 1:4.

10. The semiconductor device of claim 1, wherein the diameter of the aperture region of the aperture layer is in a range of 10 μm to 12 μm.

11. The semiconductor device of claim 1, wherein a number of the emitters is in a range of 360 to 400 to obtain the maximum output in the saturated region.

12. The semiconductor device of claim 1, wherein the device includes a mesa region including the plurality of emitters and a region between adjacent emitters,
    wherein a shape of a corner region of the mesa region corresponds to a shape of an outermost emitter among the plurality of emitters.

13. The semiconductor device of claim 12, wherein the corner region of the mesa region has a round shape.

14. The semiconductor device of claim 12, wherein a spacing between the corner region of the mesa region and the outermost emitter is equal to a spacing between adjacent emitters located at a center of the mesa region.

15. A semiconductor device comprising:
    a substrate; and
    a plurality of emitters on the substrate,
    wherein the emitter includes:
    a first conductive-type reflective layer having a first reflectance;
    an active layer on the first conductive-type reflective layer;
    an aperture layer on the active layer and including an aperture region and a blocking region surrounding the aperture region; and
    a second conductive-type reflective layer on the aperture layer and having a second reflectance smaller than the first reflectance,
    wherein the device includes a mesa region including the plurality of emitters and a region between adjacent emitters,
    wherein a shape of a corner region of the mesa region corresponds to a shape of an outermost emitter among the plurality of emitters, wherein a spacing between the corner region of the mesa region and the outermost emitter is equal to a spacing between adjacent emitters located at a center of the mesa region, and wherein a spacing between the corner region of the mesa region and the outermost emitter is in a range of 5 µm to 9 µm.

16. The semiconductor device of claim 15, wherein a ratio between a diameter of the aperture region of the aperture layer and a pitch is in a range of 1:3 to 1:5, and wherein the pitch is defined as a distance between centers of aperture regions of aperture layers of adjacent emitters.

17. A semiconductor device package comprising:
a second substrate;
a semiconductor device on the second substrate;
first and second electrodes on the second substrate and electrically connected to the semiconductor device;
a housing on the second substrate and disposed around the semiconductor device, wherein the housing has a step in a top thereof; and
a diffuser disposed in the step of the housing, and disposed on the semiconductor device,
wherein the semiconductor device includes:
a first substrate; and
plurality of emitters on the first substrate,
wherein the emitter includes:
a first conductive-type reflective layer having a first reflectance;
an active layer on the first conductive-type reflective layer;
an aperture layer on the active layer and including an aperture region and a blocking region surrounding the aperture region; and
a second conductive-type reflective layer on the aperture layer and having a second reflectance smaller than the first reflectance,
wherein a ratio between a diameter of the aperture region of the aperture layer and a pitch is in a range of 1:3 to 1:5,
wherein the pitch is defined as a distance between centers of aperture regions of aperture layers of adjacent emitters,
wherein the device has a saturated region in which a maximum output at a temperature higher than a room temperature is saturated, and
wherein the maximum output in the saturated region is obtained in the ratio of the diameter of the aperture region of the aperture layer and the pitch.

18. An auto focusing device comprising:
the semiconductor device package of claim 17; and
a receiver for receiving light emitted from the semiconductor device package and then reflected from an object.

* * * * *